Jan. 26, 1971 P. L. BEAUDOUIN ET AL 3,559,003

UNIVERSAL METALLURGY FOR SEMICONDUCTOR MATERIALS

Filed Jan. 3, 1969

INVENTORS

PIERRE L. BEAUDOUIN
REINHARD GLANG
JACOB RISEMAN

BY Melvyn D. Silver
AGENT

United States Patent Office 3,559,003

Patented Jan. 26, 1971

3,559,003

UNIVERSAL METALLURGY FOR SEMICONDUCTOR MATERIALS

Pierre L. Beaudouin, Reinhard Glang, and Jacob Riseman, Poughkeepsie, N.Y., assignors to International Business Machines Corporation, Armonk, N.Y., a corporation of New York Filed Jan. 3, 1969, Ser. No. 788,822
Int. Cl. H01l 1/14, 5/02
U.S. Cl. 317—234 12 Claims

ABSTRACT OF THE DISCLOSURE

The process for making, and the structure of, an interconnection and resistor network upon a semiconductor surface. This network includes ohmic contacts to the semiconductor which comprise the combination of a Cr-SiO cermet material having a copper conductor thereon. This combination of materials is also utilized for interconnections between ohmic contacts. Where a resistor is desired along an interconnection line, the copper conductor is removed, causing the current, when an electric field is applied, to pass through the cermet material which now functions as a resistor.

FIELD OF THE INVENTION

Processes and structures relating to ohmic contacts upon semiconductor devices, including methods of contact, composition, and structure.

BACKGROUND OF THE INVENTION

It is known to fabricate aluminum ohmic contacts and aluminum interconnections on an oxide-coated semiconductor by etching the desired contact area in the oxide layer to the semiconductor surface, and then selectively depositing aluminum on the oxide surface to form the interconnection lines and at the same time, depositing aluminum in the etched area to form the ohmic contact. This type of contact-interconnection, however, is not completely satisfactory for a number of reasons. First of all, aluminum, when exposed to air, readily forms an oxide on its surface so that any electrical connections made with the oxidized surface of the interconnection will be undesirable because of the high resistivity of the oxide layer. Also, in the same vein, it is very difficult to solder aluminum and poor mechanical bonds usually will result. Moreover, aluminum reacts with the oxide layer of the semiconductor, and, hence, presents the possibility of short circuits by the penetration of aluminum through the oxide layer. At temperatures approaching the eutectic temperature of aluminum and silicon and above, the rate of penetration is appreciable. Direct deposition of gold, copper, or silver conductors directly upon the semiconductor surface or its protective oxide have resulted in similar problems.

Thus, an object of this invention is to provide ohmic contacts to semiconductor materials with contact resistances as low as those obtained with aluminum.

A further object is to allow low resistance circuit interconnections and ohmic contacts on a surface of the semiconductor material.

Still another object is to allow these low resistance circuit interconnections and ohmic contacts to be made at one time by vapor deposition during a single pumpdown of a vacuum system.

Yet another object is to provide a built-in option for providing integrated thin film resistors which are superior to diffused silicon resistors in regard to tolerances, temperature coefficients and resistance, available sheet resistance range, and layout area requirements concurrently with the making of ohmic interconnections on the semiconductor surface.

Another object is to prevent copper from reaching the semiconductor surface and thereby cause junction degradation.

SUMMARY OF THE INVENTION

These and other objects are met by the method and structure of this invention. Briefly stated, in one structure embodiment, a Cr-SiO cermet material contacts those areas of a semiconductor material in which ohmic contact is desired through holes in the insulating layer upon the semiconductor material. A copper layer is placed upon the cermet layer, and a chromium layer is placed upon the copper layer, at the ohmic contact areas. The cermet-semiconductor interface is a diffused boundary area.

The Cr-SiO film acts as a diffusion barrier, preventing the copper (or silver or gold) conducting material from diffusing into and affecting the semiconductor material properties, and thus allowing usage of these highly conductive materials. Further, the Cr-SiO has excellent adhesion properties and low contact resistance both with the semiconductor material and the insulating $SiO_2$ layer.

While one structure in one embodiment has been described above, this invention as to structure and process will best be understood when read in conjunction with the following drawings and general description.

IN THE DRAWINGS

GENERAL DESCRIPTION

Figure 1:
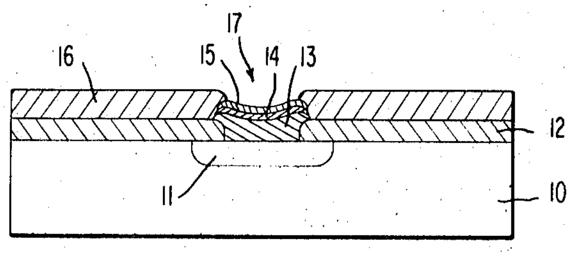
FIG. 1 is a cross-section of a semiconductor material having an ohmic contact at one area thereof.

While the invention described is applicable to the simultaneous formation of a plurality of contacts and interconnections, the following description will be primarily concerned with the formation of one contact and one interconnection on a silicon type semiconductor body as partially shown in FIGS. 1 and 2. As is well known in the art, there are within the body of semiconductor devices, N-type and P-type regions which are formed by diffusing N-type and P-type dopants into an intrinsic semiconductor material.

As shown in all of the figures, the surface of a silicon semiconductor body is coated with an oxide layer preferably by thermal oxidation. This layer may be further built up during diffusion of the dopants into the body, at elevated temperatures, by carrying out the diffusion in an oxidizing atmosphere. Methods other than the above preferred thermal oxidation may be used to form the insulating layer such as anodic oxidation, pyrolytic decomposition of siloxanes, or oxidation of silane. This layer may vary from a few thousand angstroms to one micron or more in thickness. Alternately, silicon monoxide, silicon nitride in combination with silicon dioxide, or a more complex oxide of silicon with an oxide of phosphorus, aluminum or boron and various combinations thereof, may constitute the layer if desired. If a germanium type semiconductor is used, it is preferred to coat with silicon dioxide or silicon monoxide using techniques well known in the art. In both cases, the oxide surface is durable and firmly adherent to the semiconductor body. Furthermore, it can serve as a good electrical insulator between the semiconductor body and an interconnection metal deposited on the oxide layer, if the metal does not react with the layer and penetrate through to one of the regions in the semiconductor body.

For connecting the semiconductor into a circuit, contacts must be formed on the active regions of the semiconductor and interconnections attached to the contacts. Ohmic contacts are the most desirable because they have linear current conducting characteristics in both directions, and they have a resistance which is the inherent resistance of the semiconductor body material.

FIG. 1 shows the ohmic contact of this invention. FIG. 1 shows a semiconductor body 10 of, for example, P-type silicon. An active N-type area 11 is formed within the body of semiconductor material 10 by any of the known techniques, as described previously. An insulating layer 12, such as $SiO_2$ or silicon nitride in combination with $SiO_2$, is formed upon the surface of the semiconductor material 10, 11, in accordance with known procedures as also discussed previously. Through standard photo-etch methods, for example, a hole is opened in the insulating material 12 to expose a portion of the region 11 to which, in this example, it is desired to make an ohmic contact. Utilizing methods to be discussed in greater detail in conjunction with FIG. 2, a Cr-SiO cermet layer 13 is deposited to contact active area 11. Next, a layer of electrically conducting material 14, preferably copper, but also gold or silver or the like, is placed upon the cermet layer 13. Then a chromium layer 15 is placed upon the copper layer 14. Lastly, a final passivating layer 16 is placed upon the semiconductor to completely cover those areas initially covered by insulating layer 12, but exposing an area 17 to allow external connection to join the semiconductor 10 into an external circuit.

While FIG. 1 shows a cross-section of the basic structure of this invention, a detailed description as to the method of making this ohmic contact and the compositions and criteria involved with each of the layers, as well as their functions, is best described in conjunction with FIG. 2.

Figure 2A:
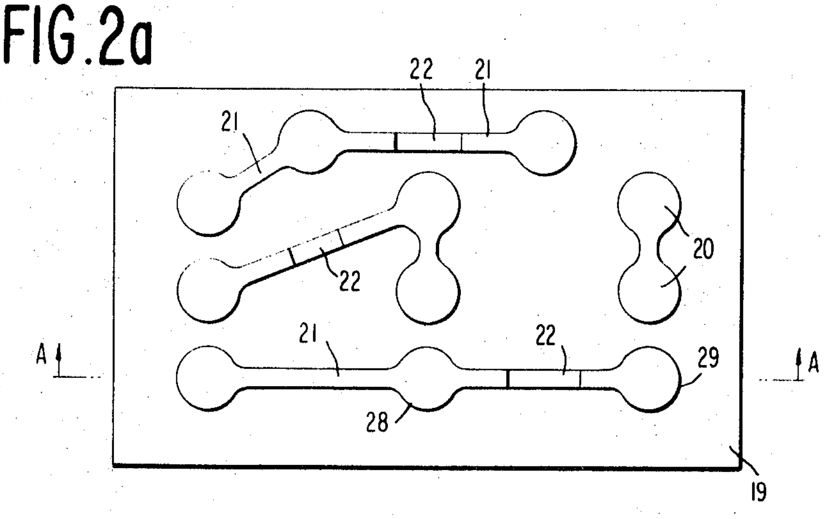
FIG. 2A is a top view of a semiconductor material having a series of ohmic contacts, and a series of interconnecting lines including resistors thereon.
Figure 2B:
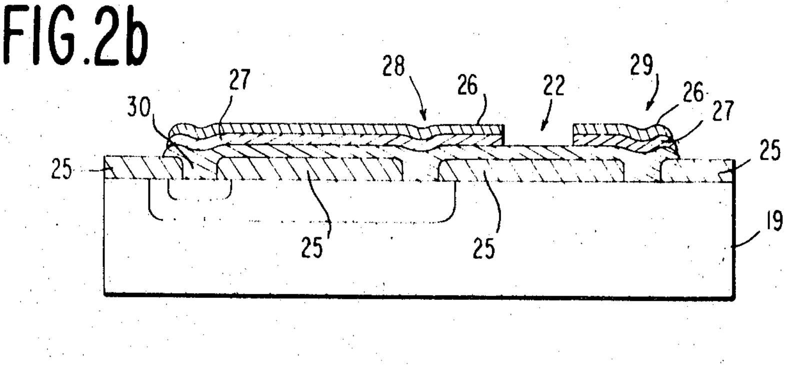
FIG. 2B is a cross-section through the section AA of FIG. 2A above, showing the interconnection lines and the cermet resistor area.

FIG. 2 is a top view of a semiconductor having a series of ohmic contact areas 20, with a series of interconnecting lines 21. FIG. 2B shows a cross-section through area AA, to further illustrate this invention. The semiconductor material 19, such as silicon, having insulating layer 25, such as silicon dioxide, silicon monoxide, or silicon nitride, and having holes therein to expose those areas upon semiconductor material 19 where it is desired to make ohmic contact, is placed in a vacuum system, and the system evacuated. After evacuation, the substrate 19 is raised to a temperature preferably of 200° C. The minimum temperature to which the substrate can be raised is approximately 100° C., below which adhesion of subsequently deposited films will be poor, and should not exceed 500° C., at which point control of deposition is difficult.

When the substrate is at temperature, a Cr-SiO cermet film is evaporated upon the semiconductor wafer. It is preferable to use flash evaporation of a pre-sintered material. However, it is also possible to simultaneously evaporate chromium from one crucible and silicon monoxide from another. The control of composition will not be as good with this method as with using presintered material, however. The preferred deposited thickness is approximately 1000 A. More or less can be used depending on the sheet resistance desired if a resistor network is going to be finally incorporated, as it will be in this example.

The cermet 30 is deposited over the entire area including the insulating layer 25. The composition limitations on the cermet are 10 atomic percent minimum to 50 atomic percent maximum SiO, with the preferred composition of 20 atomic percent SiO.

Next, a conductor film 27 is deposited over the entire wafer. This conductor film is preferably copper, although silver or gold may also be utilized. The thickness deposited depends upon the conductivity requirements, and one micron has been found to be sufficient for many applications. The substrate is still maintained at a 200° C. deposition temperature. It is important that this deposition should follow as quickly as possible after the cermet deposition to avoid oxidation of the cermet layer, and thus provide the best adhesion. Failure to evaporate the conductive layer promptly can result in oxidation having a significant effect upon contact resistance.

Immediately upon completion of the deposition of the conductor film, a flash layer 26, such as Cr, Ti or the like, between 100 and 1000 A., preferably 300–500 A., is deposited over the copper. This is to allow a subsequent passivating layer of, for example, RF sputtered quartz to adhere well to the surface. After deposition of the chromium, the wafer is removed from the vacuum system.

The semiconductor may be brought to its final interconnection and resistor network pattern utilizing standard photo-resist and etching methods. This network appears as a series of lines and paths to and from the holes as shown in FIG. 2A. After the initial etching, a series of lines, such as interconnecting lines 21 are upon the substrate. Where it is desired to have a resistance path as well, a portion of the conductive chromium 26 and copper 27 materials must be removed, as shown at 22, FIG. 2B. Thus, in going from contact area 28 to contact area 29, the current will initially pass along the path of least resistance, through the metal layers atop the cermet layer 30, until the metal layers terminate, at which time the current will proceed through the cermet in area 22, which is of higher resistance than the conductive lines. Thus, by a second etching step, resistors are incorporated with interconnection lines.

Once the interconnection and resistor network pattern is complete, it is necessary to post-bake the semiconductor, at a temperature between 300–500° C. for one hour. This is to allow the cermet-silicon contact to reach a minimum resistance value.

At this point, the device is tested and if accepted, a stable inorganic amorphous insulating coating, such as a passivating layer of RF sputtered glass, sedimented glass, or other passivating material such as $SiO_2$, a composite coating of a layer of $SiO_2$ with an overlying layer of $Si_3N_4$, coatings of complex glasses such as borosilicate, alumina borosilicate, lead borosilicate, etc., either alone or in combination with an overlying layer of $Si_3N_4$ is placed over the entire surface, with holes being opened over the ohmic contact areas for external connection. If desired, additional metallurgy may then be applied to these areas, or contact made directly to them.

The effect of a post-bake at temperatures above 500° C. is shown in the following table, and is compared with the standard aluminum film contact currently in general use.

TABLE I

| Silicon surface | Contact hole diameter in mils | Average Cr-SiO contact resistance (Ω) after 20 min. sintering at— | | | | Al film contacts sintered at 500° C. |
|---|---|---|---|---|---|---|
| | | As dep. | 500° C. | 600° C. | 700° C. | |
| N+, $C_0=7.10^{20}$ cm.$^{-3}$ | 2 | .06 | .07 | .11 | .5 | .07 |
| P, $C_0=3.10^{19}$ cm.$^{-3}$ | 2 | 30 | 12 | 20 | 60 | .10 |

It should be noted that the cermet serves a series of functions. It serves as an ohmic contact to the semiconductor, while also forming a bonding layer for the conductive metallurgy to be placed thereon, while also serving as a diffusion barrier to prevent the conductive metallurgy from diffusing into and affecting the semiconductor material. By its very nature, removal of the surface metallurgy from the cermet also allows the cermet to be utilized as resistor sites. Thus, in a single process, resistors, interconnecting lines, and ohmic contacts may be placed upon the surface of a semiconductor material economically, and utilizing available techniques, without requiring the development of new or novel equipment. Thus, as shown in the table, ohmic contacts to N- and P-type silicon with contact resistances as low as with aluminum have been obtained. Low resistance circuit connections are thus made following multilayer depositions in a single pump-down of a vacuum system. These contacts are of excellent thermal stability and current carrying capacity by the inherent nature of the material utilized, the cermet and copper in particular. Further, there is a built-in option for providing integrated thin film resistors at the same time as making interconnection and ohmic contacts.

While the process and structures described have been shown for illustrative purposes utilizing silicon semiconductor material, it is clear that with an adjustment of temperature, germanium or other semiconductor materials can be utilized, where it is desired to have an ohmic contact while also providing the options of utilizing high conductive materials close to the semiconductor material, and providing options toward interconnection and resistor network patterns as well.

While the invention has been particularly shown and described with reference to preferred embodiments thereof, it will be understood by those skilled in the art that various changes in form and details may be made therein without departing from the spirit and scope of the invention.

What is claimed is:

1. A semiconductor having ohmic contacts thereon, comprising:
 a semiconductor material;
 an insulating layer upon at least a first surface of said semiconductor material, said insulating layer having holes therein exposing those areas of said semiconductor material to which it is desired to make ohmic contact;
 a Cr-SiO cermet material layer upon at least said areas; and
 a layer of electrically conductive material upon said cermet material layer,
 whereby ohmic contact to said semiconductor material is achieved through said cermet-electrically conductive material layers.

2. The semiconductor of claim 1 wherein said Cr-SiO cermet material layer comprises SiO in the range of substantially 10–50 atomic percent SiO.

3. The semiconductor of claim 1 wherein said Cr-SiO cermet material layer comprises substantially 20 atomic percent SiO.

4. The semiconductor of claim 1 wherein said Cr-SiO film is substantially 1000 A. thick.

5. The semiconductor of claim 1 wherein said electrically conductive material is chosen from the group consisting of copper, silver or gold.

6. A semiconductor having an interconnection and resistor network thereon comprising:
 a semiconductor material;
 an insulating layer upon at least a first surface of said semiconductor material, said insulating layer having holes therein exposing those areas of said semiconductor material to which it is desired to make ohmic contact;
 a Cr-SiO cermet material layer upon at least said areas, said Cr-SiO cermet material layer also extending upon said insulating layer in a desired interconnection and resistor network pattern; and
 a layer of electrically conductive material upon said cermet material layer at said areas and along said interconnection and resistor network pattern wherever it is desired that electrical current be carried by said electrically conductive material, those uncovered areas of said cermet material layer serving as resistors within the interconnection and resistor pattern,
 whereby ohmic contact to said semiconductor material is achieved concurrent with an interconnection and resistor network.

7. The semiconductor of claim 6 wherein said insulating layer comprises an oxide or a nitride of silicon or a composite combination thereof.

8. The semiconductor of claim 6 wherein said Cr-SiO cermet material layer comprises SiO in the range of substantially 10–50 atomic percent SiO.

9. The semiconductor of claim 6 wherein said Cr-SiO cermet material layer comprises substantially 20 atomic percent SiO.

10. The semiconductor of claim 6 wherein said Cr-SiO film is substantially 1000 A. thick.

11. The semiconductor of claim 6 wherein said electrically conductive material is chosen from the group consisting of copper, silver, or gold.

12. A method of making interconnection to and upon a semiconductor material comprising the steps of:
 forming an insulating layer upon those surfaces of said semiconductor material to which interconnection is desired, said insulating layer having holes therein exposing those areas of said semiconductor material to which an ohmic contact is desired;
 forming a Cr-SiO cermet material layer upon said insulating layer;
 forming a conductive material layer upon said cermet material layer;
 forming an interconnection network pattern by selectively removing said cermet and conductive material and chromium layers from all areas other than those desired to constitute said interconnection network pattern; and
 baking said semiconductor material at an elevated temperature and for a time sufficient to reduce the resistance between said cermet material layer and said semiconductor material at said areas where ohmic contact is desired.

References Cited

UNITED STATES PATENTS

| | | | |
|---|---|---|---|
| 3,472,688 | 10/1969 | Hayashi et al. | 117—212 |
| 3,497,774 | 2/1970 | Hornberger | 317—101 |
| 3,386,165 | 6/1968 | Bruhl et al. | 29—621 |

JOHN W. HUCKERT, Primary Examiner

M. H. EDLOW, Assistant Examiner

U.S. Cl. X.R.

29—589; 117—212; 317—235